United States Patent
Butaye et al.

(10) Patent No.: US 7,519,335 B2
(45) Date of Patent: Apr. 14, 2009

(54) DIGITAL MODULATION SIGNAL MIXER

(75) Inventors: Benoit Butaye, Saint Martin d'Heres (FR); Luc Garcia, Saint Paul de Varces (FR)

(73) Assignee: STMicroelectronics SA, Montrouge (FR)

( * ) Notice: Subject to any disclaimer, the term of this patent is extended or adjusted under 35 U.S.C. 154(b) by 519 days.

(21) Appl. No.: 11/247,989

(22) Filed: Oct. 11, 2005

(65) Prior Publication Data

US 2006/0089110 A1 Apr. 27, 2006

(30) Foreign Application Priority Data

Oct. 12, 2004 (FR) .................................. 04 10744

(51) Int. Cl.
*H01Q 11/12* (2006.01)
*H04B 1/04* (2006.01)
(52) U.S. Cl. ........................... 455/91; 455/118; 455/333
(58) Field of Classification Search ........ 455/108–114.2, 455/323–326, 333, 118; 330/252–259, 261, 330/290–296; 327/359, 355
See application file for complete search history.

(56) References Cited

U.S. PATENT DOCUMENTS

| | | | | |
|---|---|---|---|---|
| 5,404,097 A | * | 4/1995 | Barou | ........................ 323/312 |
| 6,023,196 A | * | 2/2000 | Ashby et al. | ................. 330/290 |
| 6,492,871 B2 | * | 12/2002 | Liu et al. | ..................... 330/257 |
| 6,785,530 B2 | * | 8/2004 | Hatcher et al. | ............... 455/326 |
| 6,922,556 B2 | * | 7/2005 | Beumer | ...................... 455/333 |
| 7,280,815 B2 | * | 10/2007 | Pellat et al. | .................. 455/326 |
| 2002/0047940 A1 | | 4/2002 | Kudo et al. | |

FOREIGN PATENT DOCUMENTS

EP 0760554 A1 3/1997

OTHER PUBLICATIONS

Preliminary Search Report for French Patent Application No. 0410744 dated Apr. 20, 2005.

* cited by examiner

*Primary Examiner*—Simon D Nguyen
(74) *Attorney, Agent, or Firm*—Lisa K. Jorgenson; Jon A. Gibbons; Fleit Gibbons Gutman Bongini & Bianco P.L.

(57) ABSTRACT

The present invention includes a mixer circuit integrating a voltage-to-currrent conversion in the same stage. A mixer device 20 of a transmission system comprises a pair of transistors 41 and 42 forming a differential circuit having two differential inputs receiving a carrier $V_{LO}$, two differential current outputs delivering a differential output current and a common current output whose current is equal to the sum of the differential output currents; a current-to-voltage conversion element 47 coupled to the common current output of the pair of transistors; an amplifier 30 having a positive input receiving the modulating signal, a negative feedback input coupled to the current-to-voltage conversion element, and an output coupled to each of the differential inputs of the pair of transistors.

13 Claims, 5 Drawing Sheets

DIGITAL MODULATION SIGNAL MIXER

CROSS-REFERENCE TO RELATED APPLICATIONS

This application is based upon and claims priority from prior French Patent Application No. 04 10744, filed on Oct. 12, 2004 the entire disclosure of which is herein incorporated by reference.

FIELD OF THE INVENTION

The present invention generally relates to digital modulation techniques typically employed in mobile telephones and other data communication devices. More particularly, the present invention relates to the structure of a signal mixer for use with constellation-type modulation.

BACKGROUND OF THE INVENTION

FIG. 1 shows schematically a transmission channel of a mobile telephone. The messages are sent in the form of a data stream to a modulation encoding circuit 1 that transforms this data stream into two modulating streams I and Q that are representative of the constellation. Two digital/analog converters 2 and 3 transform the digital signals I and Q into analog signals. Two low-pass filters 4 and 5 filter the signals coming from the digital/analog converters 2 and 3 and deliver them to voltage-to-currrent converters 6 and 7. Two mixers 8 and 9 mix each of the modulating signals that are representative of the streams I and Q by means of a high-frequency carrier. Each mixer 8 or 9 receives the high-frequency carrier in quadrature, in other words the high-frequency signal is phase-shifted by a quarter period between the mixers 8 and 9. An adder circuit 10 then adds together the signals coming from the mixers 8 and 9 and delivers them to a variable-gain amplifier 11. A bandpass filter circuit 12 eliminates the parasitic images created by the mixers 8 and 9, then a power amplifier 13 amplifies the signal and delivers it to an antenna 14.

Mobile telephones have the particular constraint of requiring that the circuits be as small as possible in order to better facilitate integration and also to enable a maximum reduction in power consumption. For this purpose, a conventional approach consisting in partitioning the system into circuits corresponding to the functional partitioning shown in FIG. 1 requires, on the one hand, that the circuit dimensions be large and, on the other, a relatively high power consumption since each stage is powered independently. In order to reduce the size and power consumption of the circuits, a known solution is to produce certain functional elements grouped together within the same circuit stage.

By way of example, the U.S. patent application Ser. No. 2003/0169090 discloses a device that groups the mixer function and amplifier function together on the same stage whose teachings is hereby incorporated by reference in its entirety. However, the circuit disclosed by this US Application requires compensation means whose implementation is relatively complex.

Accordingly, what is needed is a method and system to overcome the problems encountered in the prior art and to provide a circuit that allows a high level of integration and a low power consumption for digital transmission circuits such as are shown in FIG. 1.

SUMMARY OF THE INVENTION

The present invention overcomes the problems of the prior art and provides a new solution based on a mixer circuit integrating a voltage-to-currrent conversion within the same stage.

According to a first aspect, the invention is a mixer device for a transmission system comprising a signal input terminal, two differential input terminals, first and second output terminals, a pair of transistors, a current-to-voltage conversion element and an amplifier. The signal input terminal receives a voltage that is representative of a modulating signal S(t). The two differential input terminals receive two high-frequency signals in phase opposition relative to one another. The first and second output terminals deliver two currents that are representative of the high-frequency signals modulated by the modulating signal. The pair of transistors forms a differential circuit having two differential control inputs each coupled to one of the differential input terminals, two differential current outputs respectively coupled to the output terminals and a common current output whose current is equal to the sum of the differential output currents. The current-to-voltage conversion element is coupled to the common current output of the pair of transistors, and is capable of transforming the current delivered by this output into a voltage. The amplifier has a positive input, a negative-feedback input and an output. Said amplifier is capable of delivering at its output an amplified signal that is representative of the signal present at the positive input, the positive input being coupled to the signal input terminal, the negative-feedback input being coupled to the current-to-voltage conversion element, and the output being coupled to each of the differential control inputs of the pair of transistors.

According to a second aspect, the invention is differential mixer comprising a first input terminal, a second input terminal, two differential input terminals, a first output terminal, a second output terminal, a first mixer device and a second mixer device. The first input terminal receives a voltage that is representative of a modulating signal S(t). The second input terminal for receiving a voltage that is representative of a inverted modulating signal S(t). The first mixer device and the second mixer device each comprises a signal input, two differential inputs, first and second outputs, a pair of transistors, a current-to-voltage conversion element and an amplifier. The signal input of the first mixer device is linked to the first input terminal. The signal input of the second mixer device is linked to the second input terminal. The two differential inputs of each mixer device receives two high-frequency signals in phase opposition relative to one another, the two differential inputs being respectively coupled to the two differential input terminals. The first and second outputs for delivering two currents that are representative of the high-frequency signals modulated by the modulating signal. The first output of the first mi and the second output of the second mixer device are coupled together to the first output terminal. The second output of the first mixer device and the first output of the second mixer device are coupled together to the second output terminal. Each pair of transistors forms a differential circuit having two differential control inputs each coupled to one of said differential inputs, two differential current outputs respectively corresponding to said first and second outputs and a common current output whose current is equal to the sum of the differential output currents. In each mixer device, the current-to-voltage conversion element is coupled to the common current output of the pair of transistors, and is capable of transforming the current delivered by this output into a voltage. Each amplifier has a positive input, a negative-feedback input and an output, and is capable of delivering at its output an amplified signal that is representative of the signal present at the positive input. In each mixer device, the positive input corresponds to the signal input, the negative-feedback input is coupled to the current-to-voltage conversion element, and the output is coupled to each of the differential control inputs of the pair of transistors.

According to a third aspect, the invention is a quadrature signal mixer comprising a differential output pair, a first differential mixer and a second differential mixer. The differential output pair corresponds to a first and a second output terminals. Each differential mixer comprises a differential input pair, two differential input terminals, a first mixer device and a second mixer device. The differential input pair corresponding to a first and a second input terminals. The first input terminal of the first differential mixer receives a signal corresponding to a modulating signal I(t), and its second input terminal receiving a signal corresponding to an inverted modulating signal I(t). The first input terminal of the second differential mixer receives a signal corresponding to a modulating signal Q(t), and its second input terminal receiving a signal corresponding to an inverted modulating signal Q(t). The two differential input terminals receive two high-frequency signals in phase opposition relative to one another. The high-frequency signals of the second differential mixer are in phase quadrature with respect to the high-frequency signals of the first differential mixer. Each mixer device comprises a pair of transistors, a current-to-voltage conversion element and an amplifier. The pair of transistors forms a differential circuit having two differential control inputs each coupled to one of said differential input terminals of the corresponding differential mixer, two differential current outputs and a common current output whose current is equal to the sum of the differential output currents. The two differential current outputs of the first mixer devices are respectively linked to said first and second output terminals. The two differential current outputs of the second mixer devices are respectively linked to said second and first output terminals. The current-to-voltage conversion element is coupled to the common output of the pair of transistors, and is capable of transforming the current delivered by this output into a voltage. The amplifier has a positive input, a negative-feedback input and an output, and is capable of delivering at its output an amplified signal that is representative of the signal present at the positive input, the negative-feedback input being coupled to the current-to-voltage conversion element, and the output being coupled to each of the differential control inputs of the pair of transistors. The positive input of the first mixer devices is linked to the first input terminal of the corresponding differential mixer. The positive input of the second mixer devices is linked to the second input terminal of the corresponding differential mixer.

According preferred embodiments of the first to third aspect of the invention, each mixer device may comprise a low-pass filter between the current-to-voltage conversion element and the negative-feedback input of the amplifier. Each amplifier may comprise an input stage followed by an output stage, and the mixer device may comprise a compensation circuit linking a node between the input stage and the output stage with the common output of the pair of transistors. The mixer device may comprise a low-pass filter between the input terminal and the positive input of the amplifier.

According to a further aspect, the invention is a data transmission system that comprises: means for producing two modulating signals from a data stream, each modulating signal being delivered in differential mode; a quadrature signal mixer, receiving one of the modulating signals at each of its pairs of differential inputs; and means for variable-gain differential amplification coupled to the pair of differential outputs of the quadrature signal mixer.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 2:
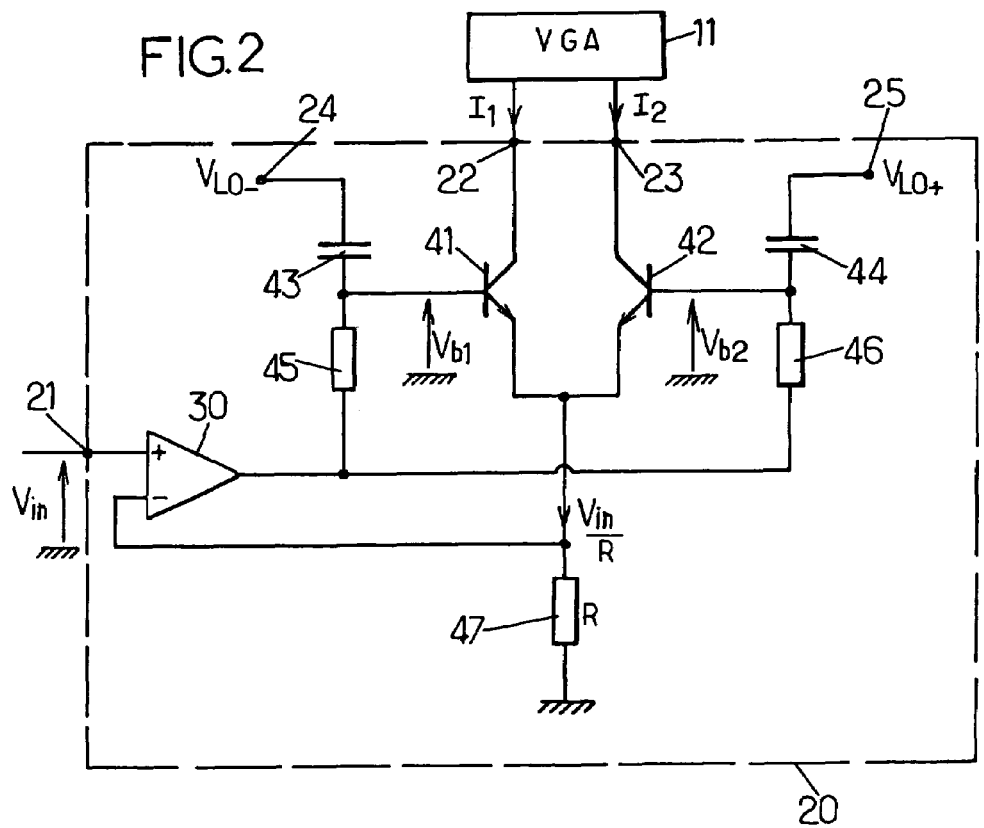
FIG. 2 is a schematic of a functional circuit diagram of a mixer, according to the present invention.

FIG. 2 is a schematic of a mixer device 20 that comprises an input terminal 21 receiving an input signal $V_{in}$. The mixer device 20 also comprises two output terminals 22 and 23 which are differential outputs delivering a current $I_1$ and $I_2$, respectively. Two other input terminals 24 and 25 receive two high-frequency signals that correspond to the carrier signal. The two high-frequency signals, denoted $V_{LO-}$ and $V_{LO+}$, correspond to the same signal in phase opposition.

The mixer device comprises an amplifier 30, for example an operational amplifier having a positive input, a negative input and an output. The positive input corresponds to a signal input and is coupled to the input terminal 21. The negative input corresponds to a negative-feedback input. Initially, the amplifier is considered to be a perfect operational amp.

The mixer device 20 also comprises a pair of transistors 41 and 42 forming a differential circuit of a conventional type. This differential circuit has two differential control inputs that correspond, respectively, to the bases of the transistors 41 and 42, a common current output that corresponds to the emitters of the pair of transistors 41 and 42 and also two differential current outputs that correspond, respectively, to the collectors of the transistors 41 and 42. The bases of the transistors 41 and 42 are coupled to the input terminals 24 and 25 via capacitors 43 and 44, respectively, and also to the output of the amplifier 30 via resistors 45 and 46. The emitters of the transistors 41 and 42, corresponding to the common current output of the differential circuit, are coupled to a resistor 47 that acts as a current-to-voltage conversion element. This resistor 47 has its other terminal coupled to ground. In addition, the node formed between the common current output and the resistor 47 is coupled to the negative-feedback input of the amplifier 30.

The output terminals 22 and 23 are coupled to a variable-gain amplifier 11.

Figure 3:
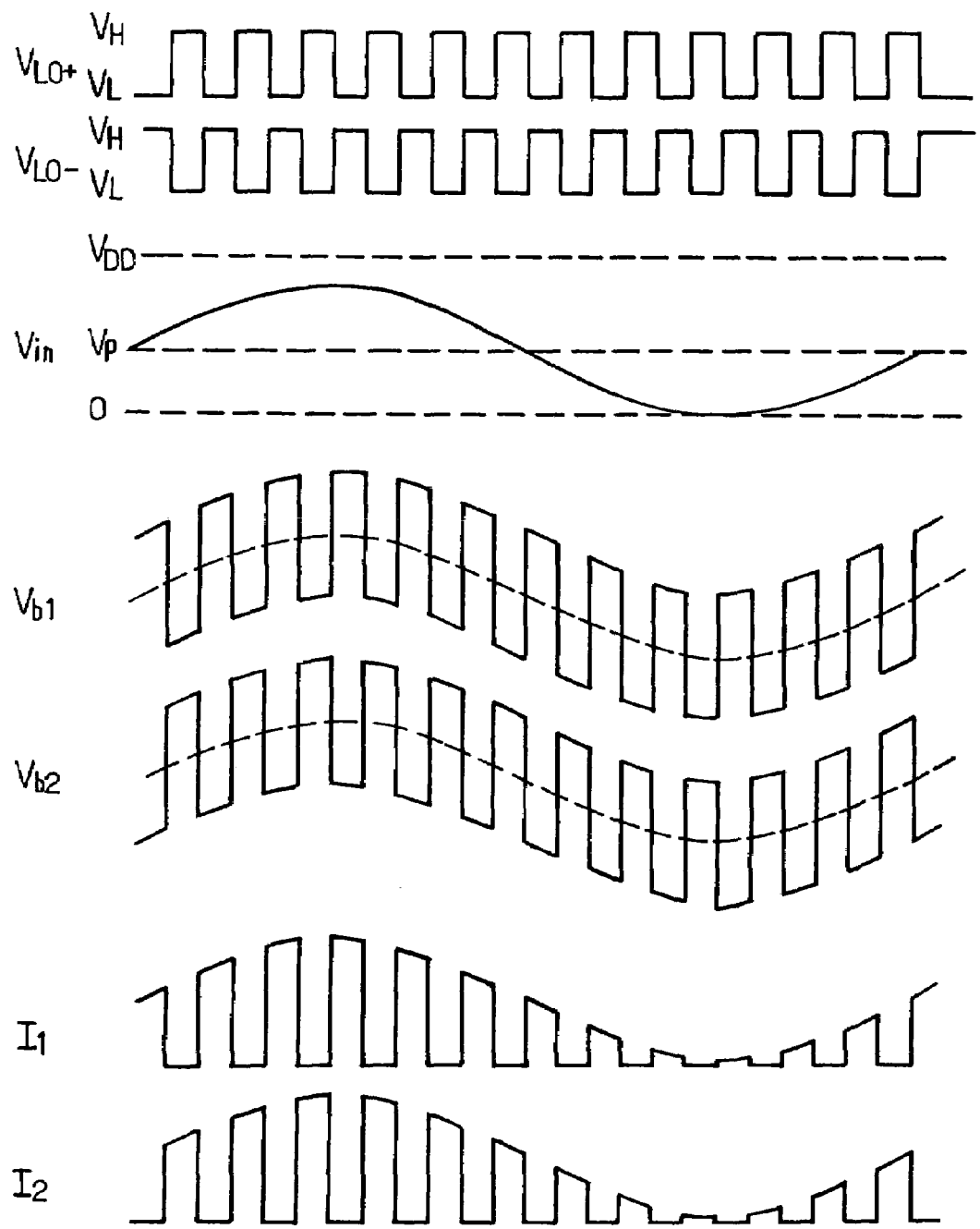
FIG. 3 illustrates the operational curves of the circuit in FIG. 2, according to the present invention.

The operation of the circuit in FIG. 2 will now be explained with the aid of the curves shown in FIG. 3. The high-frequency signals $V_{LO-}$ and $V_{LO+}$ received by the input terminals 24 and 25 are shown in FIG. 3. These are from the same signal in phase opposition and are very high frequency. The frequency of the signal corresponds, for example, to a carrier frequency of around 900 MHz. From a strictly theoretical standpoint, the carrier signal should be a sine wave but, for practical reasons, a square-wave signal is used that has a duty cycle equal to a half, in other words the carrier signal is equal to a high-level voltage $V_H$ for one half period and then is equal to a low-level voltage $V_L$ for the other half period. In order to explain the operation of this circuit in FIG. 2, the signals $V_{LO+}$ and $V_{LO-}$ are considered to be perfect square-wave signals, in other words with rising and falling edges whose duration is zero. The signals $V_{LO+}$ and $V_{LO-}$ are shown in FIG. 3 and are both in the range between the low-level voltage $V_L$ and the high-level voltage $V_H$.

The input signal $V_{in}$ corresponds to a modulating signal. This input signal $V_{in}$ is shown in FIG. 3, by way of non-limiting example, as being a sine wave at a low frequency relative to the frequency of the signals $V_{LO+}$ and $V_{LO-}$. For practical reasons, the frequency ratio between the signal $V_{in}$ and the signals $V_{LO+}$ and $V_{LO-}$ is not adhered to. The signal $V_{in}$ is a sine wave added to a DC component $V_p$. The amplifier 30 amplifies the input signal $V_{in}$ and delivers it to the bases of the transistors 41 and 42 via the resistors 45 and 46. Furthermore, the values of the capacitors 43 and 44 are chosen such that they behave as an open circuit with respect to the maximum frequency of the signal $V_{in}$, which maximum frequency is, for example, equal to a few tens of KHz. On the other hand, these capacitors 43 and 44 behave as conductors with respect to the high-frequency signal corresponding to the signals $V_{LO+}$ and $V_{LO-}$.

Thus, the respective base voltages $V_{b1}$ and $V_{b2}$ of the transistors 41 and 42 correspond to the sum of the output voltage of the amplifier 30 added to the respective signals $V_{LO+}$ and $V_{LO-}$, as shown in FIG. 3. Thus, when the signal $V_{LO+}$ is equal to the high-level voltage $V_H$ and the signal $V_{LO-}$ is equal to the low-level voltage $V_L$, the transistor 42 is turned on and the transistor 41 is turned off, the current flowing in the transistor 42 then being proportional to the voltage $V_{in}$. When the signal $V_{LO+}$ is equal to the low-level voltage $V_L$ and the signal $V_{LO-}$ is equal to the high-level voltage $V_H$, the transistor 41 is turned on and the transistor 42 is turned off, the current flowing through the transistor 41 then being equal to a current proportional to the voltage $V_{in}$. The sum of the currents 41 and 42 corresponding to the current delivered by the common output is therefore proportional to the voltage $V_{in}$. This current is delivered to the resistor 47 of value R and is then equal to $V_{in}/R$ since the amplifier 30 is an operational amplifier that is considered to be perfect, the voltage at its positive input and the voltage at its negative input being considered equal and with no current flowing into this amplifier. Such a feedback loop on the amplifier ensures that there is a current equal to $V_{in}/R$ on the common output of the differential circuit. As explained previously, the transistors 41 and 42 are alternately turned off and on, with only one of the transistors being on at a time, which yields a form of current $I_1$ and $I_2$ as shown in FIG. 3 that corresponds to a current whose envelope is proportional to $V_{in}$ multiplied, respectively, by the signals $V_{LO+}$ and $V_{LO-}$.

If the currents $I_1$ and $I_2$ are subtracted, a current whose form corresponds to a square wave signal with an envelope corresponding to $V_{in}$ is obtained.

If $V_{LO+}$ is considered to correspond to a binary carrier denoted $P_{(t)}$ which can take the logic levels "0" or "1", then $V_{LO-}$ corresponds to $1-P_{(t)}$ or alternatively to $\overline{P}_{(t)}$. The expression for the signal $V_{in}$ corresponds to $V_p+S_{(t)}$, where $V_p$ is a DC voltage and $S_{(t)}$ is the modulating signal, the following formulae are then obtained:

$$I_1 = \frac{V_p + S_{(t)}}{R} P_{(t)}$$

$$I_2 = \frac{V_p + S_{(t)}}{R} (1 - P_{(t)})$$

Thus, taking the difference $I_1-I_2$ since the current outputs are differential, the following expression is obtained:

$$I_1 - I_2 = \frac{V_p + S_{(t)}}{R} (2P_{(t)} - 1)$$

The difference $I_1-I_2$ corresponds to the carrier $2P_{(t)}-1$ modulated by the signal $S_{(t)}$ with a factor 2/R. The carrier $2P_{(t)}-1$ has the same form as the carrier P(t) but with a "0" level equal to "−1".

Figure 4:
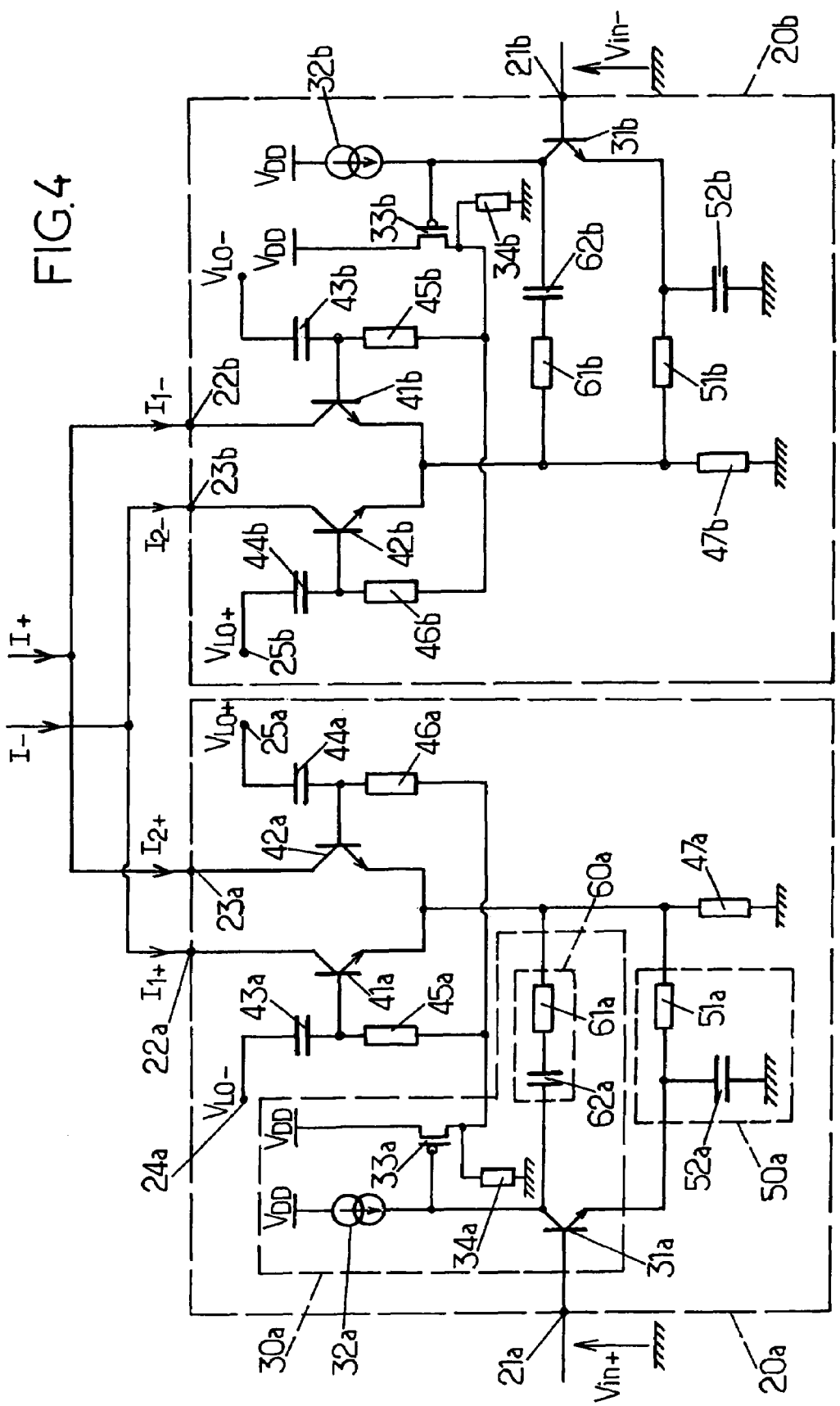
FIG. 4 is a schematic of a differential mixer based on the mixer in FIG. 2, in another embodiment with additionally improvements, according to the present invention.

The circuit diagram in FIG. 2 is a functional representation of the mixer device that is the subject of the invention. However, in order to explain its operation, certain assumptions were made, notably that the amplifier 30 was a perfect operational amplifier and that the carrier signal was a perfect square wave signal. For the implementation of this device in integrated circuits, it should now be shown how this circuit is produced taking into account its real properties. Moreover, this circuit shows how a signal is modulated obtaining two differential current outputs from a single input signal. For mobile telephones, in order to overcome certain problems of voltage shift, especially at the input $V_{in}$, and also of other voltage shifts, the circuit should operate in differential mode. FIG. 4 is a schematic of the constitution of a differential mixer, based on the circuit diagram of the mixer device in FIG. 2, which has been shown in detail for a particular embodiment as an integrated circuit.

The differential mixer in FIG. 4 comprises two identical mixer devices 20a and 20b. One receives the voltage $V_{in+}$ at its signal input terminal 21a, and the other receives the voltage $V_{in-}$ at its signal input terminal 21b. The voltage $V_{in+}$ corresponds, for example, to the voltage $V_{in}$ of the circuit diagram in FIG. 2 and, in other words, a voltage equal to $V_p+S_{(t)}$, where $S_{(t)}$ is the modulating signal. The voltage $V_{in-}$ corresponds to a voltage equal to $V_p-S_{(t)}$, $V_p$ being a DC voltage. Thus, the difference $V_{in+}-V_{in-}$ corresponds to a signal equal to $2S_{(t)}$. The differential current output terminals are coupled together in an inverse configuration, in other words the terminal corresponding to the carrier voltage $V_{LO+}$ of one of the circuits is coupled to the output terminal corresponding to the carrier voltage $V_{LO-}$ and vice versa.

As indicated, the mixer devices 20a and 20b are identical and both correspond to the mixer device in FIG. 2. However, in order to distinguish between them, the indices a and b are added to the reference numbers. Thus, a reference number with or without index letter corresponds to the same element. In order to simplify the description, only the elements added to this figure are discussed. Also for simplification, the elements are detailed for the device 20a only, but they correspond to the same elements in the device 20b with an index b in place of the index a.

The amplifier 30a must be a low-noise amplifier. Thus, a relatively simplified form of amplifier should be used that comprises a minimum of transistors. As a preferred example, the amplifier is formed by a bipolar transistor 31a biased on its collector by a current source 32a. The base of the transistor 31a corresponds to the positive input of the operational amplifier 30a, the emitter of the transistor 31a corresponds to the negative input of the amplifier 30a. The transistor 31a and the current source 32a form an input stage of the amplifier 30a. The collector of the transistor 31a is coupled to the gate of a transistor 33a, and the emitter of the transistor 31a is coupled to the node, formed by the emitters of the transistors 41a and 42a and from the resistor 47a, via a low-pass filter 50a. The low-pass filter 50a is for example formed by a resistor 51a and a capacitor 52a. The amplifier 30a also comprises a PMOS transistor 33a whose source is coupled to the power supply voltage $V_{DD}$, the gate is coupled to the collector of the transistor 31a, and whose drain is coupled to ground via a bias resistor 34a. The node between the drain of the transistor 33a and the resistor 34a corresponds to the output of the amplifier 30a and is coupled to the resistors 45a and 46a in order to deliver the output signal of the amplifier 30a to the bases of the transistors 41a and 42a. The transistor 33a and the resistor 34a correspond to an output stage of the amplifier 30a. A stabilization circuit 60a is coupled between the emitter of the transistor 31a and the node formed by the emitters of the transistors 41a and 42a and from the resistor 47a. The stabilisation circuit 60a is for example formed by means of a resistor 61a and by a capacitor 62a mounted in series.

The low-pass filter 50a has been added in order to compensate for the fact that the carrier signal is not strictly a square wave signal but comprises rising and falling edges having a finite slope. When the emitter currents of the transistors 41a and 42a are added together, the slopes of the carrier signal are transformed into short pulses that are added to the theoretical current that should flow through the resistor 47a. The size of the resistor 51a is chosen such that the voltage across its terminals is negligible with respect to the voltage across the terminals of the resistor 47a and the size of the capacitor 52a is chosen such that it behaves as a short-circuit at frequencies higher than the frequency of the signal $S_{(t)}$ so as to behave as a short-circuit for the harmonic frequencies of the frequency of the signal P(t). The addition of the filter 50a has the drawback of transforming the amplifier 30a into a high-frequency amplifier. Indeed, since the latter strongly attenuates the high frequencies in the negative feedback loop, the assembly formed by the filter 30a and by the filter 50a has the effect of greatly amplifying high-frequency signals, for example noise which may be present at the input. In order to compensate for an amplification of high-frequency noise arriving at the input terminal, the amplifier 30a is equipped with a stabilisation circuit 60a that limits the total bandwidth of the amplifier 30a.

The operation of each mixer device 20a in FIG. 4 is basically the same as that in FIG. 2. Since the only operational differences are in the internal operation of the circuit, these do not have any bearing on the operation as seen from the outside of this circuit. With the aid of FIG. 5, the basic operation of the differential mixer circuit shown in FIG. 4 will now be described.

Figure 5:
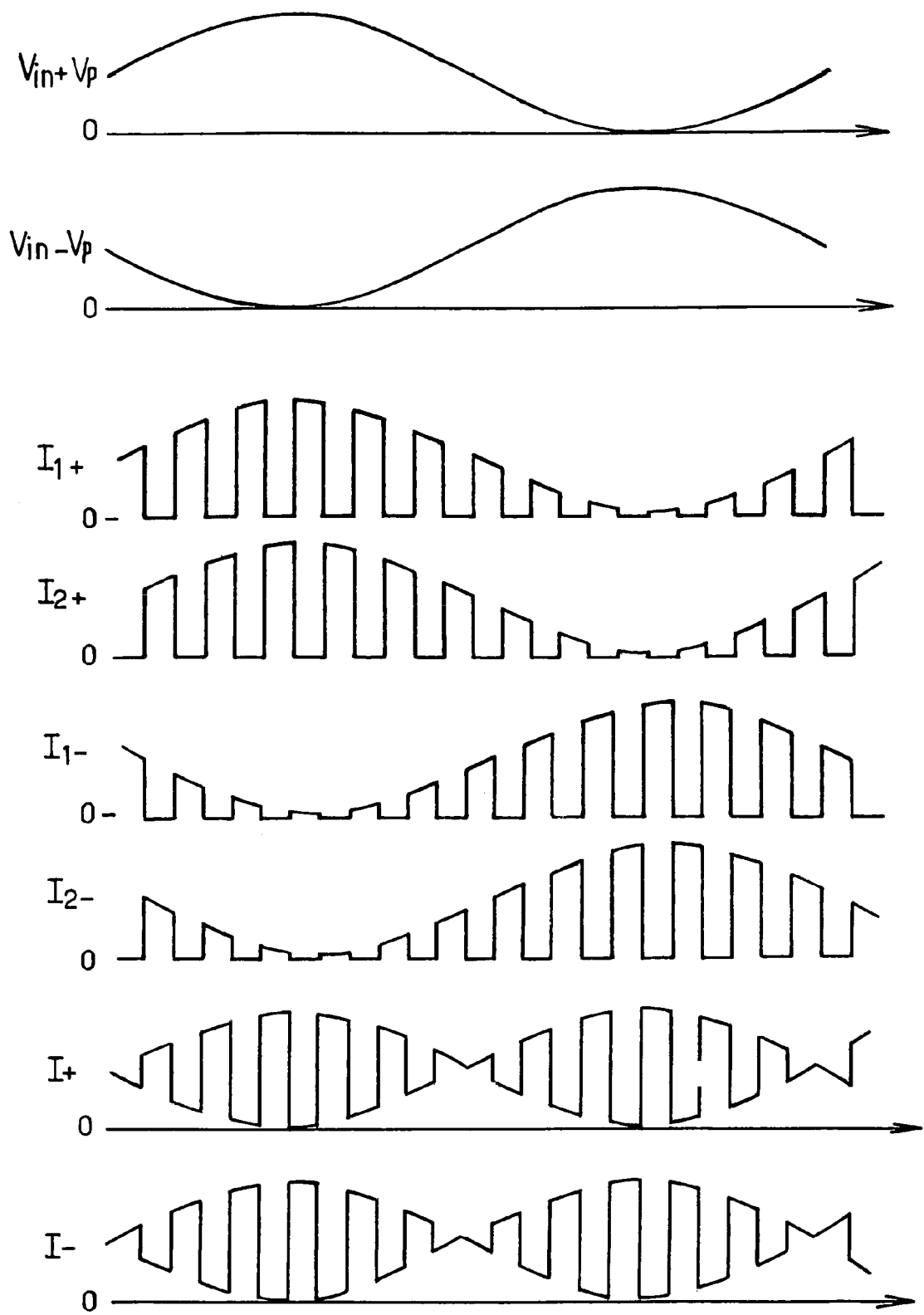
FIG. 5 illustrates operational curves of the circuit in FIG. 4, according to the present invention.

One of the mixer devices receives the voltage $V_{in+}$ and the other mixer device receives the voltage $V_{in-}$. The voltages $V_{in+}$ and $V_{in-}$ correspond to the same modulating signal $S_{(t)}$ which, for the voltage $V_{in+}$, is added to a DC voltage $V_p$ and, for the voltage $V_{in-}$, this signal $S_{(t)}$ is inverted and added to the voltage $V_p$. The circuit receiving the voltage $V_{in+}$ delivers the current $I_1-I_2$ corresponding to the current previously described with the aid of FIG. 3. The mixer device receiving the voltage $V_{in-}$ delivers the respective currents $I_{1-}$ and $I_{2-}$ corresponding to the voltage $V_{in-}$ modulated, on the one hand, by the signal $V_{LO+}$ and, on the other, by the signal $V_{LO-}$. Since the differential output terminals of the two mixer devices 20 are coupled together in an inverse configuration, the resulting differential currents $I_-$ and $I_+$ correspond, respectively, to the current $I_{1+}$ added to the current $I_{2-}$ and to the current $I_{2+}$ added to the current $I_{1-}$. The currents $I_+$ and $I_-$ are shown in FIG. 5 and correspond, respectively, to the sum of the currents indicated. If the difference of the currents $I_+$ and $I_-$ is performed, a current proportional to $I_+$ is obtained for the variable part, the DC part cancelling to zero. A current is then obtained whose form corresponds to a square wave signal centered around zero having an envelope corresponding to the signal $S_{(t)}$. Thus, from the formulae for $V_{in-}$ and $V_{in+}$ below:

$$V_{in+} = V_p + S_{(t)}$$

$$V_{in-} = V_p - S_{(t)},$$

the following output currents $I_{1+}$, $I_{2+}$, $I_{1-}$ and $I_{2-}$ are then obtained:

$$I_{1+} = \frac{V_p + S_{(t)}}{R} P_{(t)}$$

$$I_{2+} = \frac{V_p + S_{(t)}}{R} (1 - P_{(t)})$$

$$I_{1-} = \frac{V_p - S_{(t)}}{R} P_{(t)}$$

$$I_{2-} = \frac{V_p - S_{(t)}}{R} (1 - P_{(t)})$$

Then, the coupling of the two mixer devices produces the following signals $I_+$ and $I_-$:

$$I_+ = I_{2+} + I_{1-} = \frac{1}{R}(V_p + S_{(t)} - 2S_{(t)} P_{(t)})$$

$$I_- = I_{1+} + I_{2-} = \frac{1}{R}(V_p - S_{(t)} + 2S_{(t)} P_{(t)})$$

Thus, if the difference $I_+-I_{31}$ is performed, since the outputs are differential and the current must be considered in a differential manner, the following expression is obtained:

$$I_+ - I_- = 2\frac{S_{(t)}}{R}(1 - 2P_{(t)})$$

It should be noted that the part equal to $1-2P_{(t)}$ actually corresponds to a carrier corresponding to a square wave signal of the same frequency as the binary carrier $P_{(t)}$ but whose amplitude varies between −1 and 1.

Figure 1:
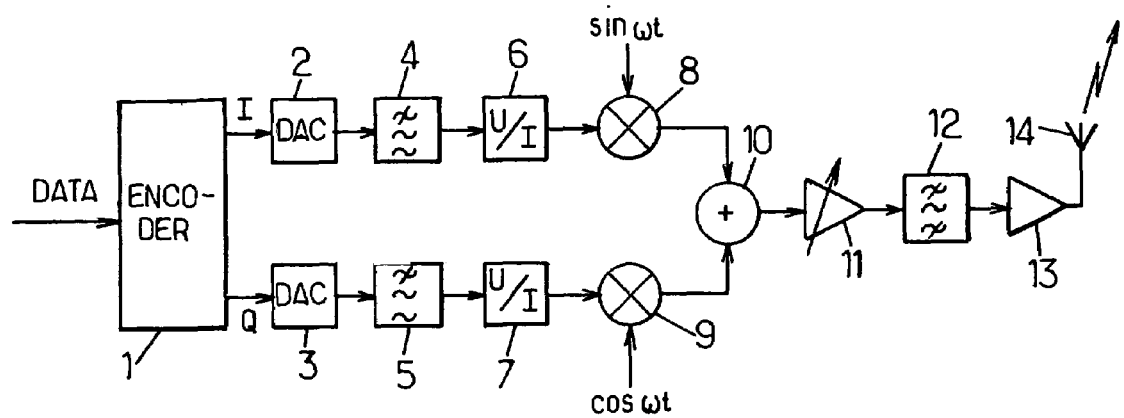
FIG. 1 is a schematic of a digital transmission circuit according to the prior art.

FIG. 4 is a schematic of an example of the integration of the differential mixer of FIG. 4 into the transmission circuit shown in FIG. 1, by integrating into the same stage, on the one hand, the filters 4 and 5, but also the voltage-to-currrent conversion circuits 6 and 7, the mixers 8 and 9, together with the adder 10 and the variable-gain amp 11.

Figure 6:
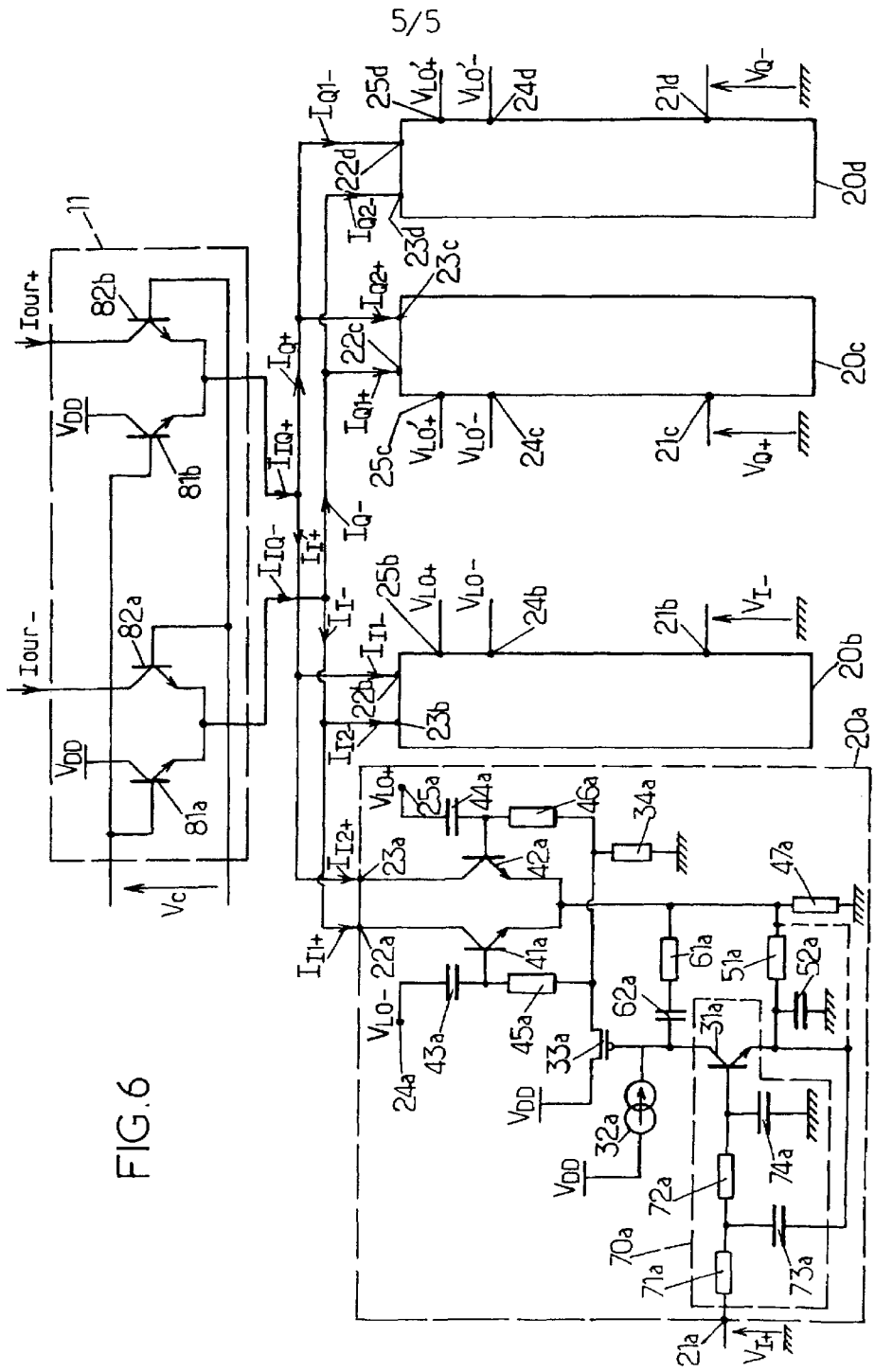
FIG. 6 is a schematic of an example of quadrature mixer integrating the voltage-to-currrent conversion together with a low-pass filtering and a variable-gain amplification function in the same stage, according to the present invention.

Four mixer devices 20a, 20b, 20c, 20d are shown in FIG. 6. Since all these mixers 20a to 20d are identical for practical reasons, only the mixer device 20a is discussed in detail. The mixer device 20a comprises all the characteristics of the mixer devices 20 and 20a previously described but also integrating a low-pass filter 70a that corresponds to the low-pass filter 4 or 5 shown in FIG. 1. The filter 70a is a filter comprising two resistors 71a and 72a mounted in series between the input of the amplifier, in other words the base of the transistor 31a, and the input terminal 21a together with two capacitors 73a and 74a. The capacitor 73a connects the node between the resistors 71a and 72a to the emitter of the transistor 31a. The capacitor 74a is coupled between the node between the resistor 72a and the base of the transistor 31a, on the one hand, and on the other hand, to ground. It should be noted that the capacitor 73a can be indirectly coupled to the emitter of the transistor 31a by being coupled to the node between the resistor 47a and the emitters of the transistors 41a and 42a. It should also be noted that the transistor 31a corresponds to an active element of the filter 70a in addition to forming part of the amplifier 30a. This filter 70a behaves as an active second-order low-pass filter and will suppress the noise associated with the digital converter situated upstream. The basic operation of the device 20a is the same as the devices 20 and 20a previously described and including the filtering device 70a whose purpose is to obtain a signal at the input that is cleaner than the signal delivered by the digital/analog converter.

In order to form a quadrature differential mixer, the four mixer devices 20a to 20d only differ by virtue of their external connection. The mixer device 20a will receive at its input a voltage $V_{I+}$ that corresponds to a modulating signal corresponding to the stream I to which a DC voltage has been added. The mixer device 20b will receive a voltage $V_{I-}$ that corresponds to the inverse of a voltage that is representative of the signal I to which a DC voltage has been added. The mixer devices 20a and 20b receive the same signal $V_{LO-}$ at their terminals 24a and 24b and, at their terminals 25a and 25b, the same signal $V_{LO+}$. The signals $V_{LO-}$ and $V_{LO+}$ correspond to an oscillator as previously described. The outputs of the mixer devices 20a and 20b are coupled together in an inverse configuration in order to obtain the output currents $I_{I+}$ and $I_{I-}$ that are representative of the differential mixing of the input voltages $V_{I+}$ and $V_{I-}$. The currents $I_{I+}$ and $I_{I-}$ take the form shown in FIG. 5 and that corresponds to the currents $I_{+}$ and $I_{-}$.

The mixer device 20c receives, at its input terminal 21, a voltage $V_{Q+}$ that corresponds to the modulating signal that is representative of the stream Q added to a DC voltage. The mixer device 20d receives, at its input terminal 21, a voltage $V_{Q-}$ that corresponds to the inverse of the modulating signal that is representative of the stream Q to which a DC voltage is added. The input terminals 24a and 24b receive the same signal $V'_{LO-}$ and the terminals 25a and 25b receive $V'_{LO+}$. These voltages $V'_{LO-}$ and $V'_{LO+}$ correspond to a carrier of the same frequency and of the same nature as the signals $V_{LO-}$ and $V_{LO+}$ but phase-shifted by a quarter period. The outputs of the mixer devices 20c and 20d are coupled together in an inverse configuration in order to obtain the signals $I_{Q+}$ and $I_{Q+}$ that are of the same nature as the signals $I_{I+}$ and $I_{I-}$ but with a carrier frequency phase-shifted by a quarter period.

The conductors carrying the signals $I_{I+}$ and $I_{Q+}$ are coupled together in order to deliver a current $I_{IQ+}$ equal to the sum of the currents $I_{I+}$ and $I_{Q+}$. The conductors carrying the signals $I_{I-}$ and $I_{Q-}$ are coupled together in order to deliver a current $I_{IQ-}$ equal to the sum of the current $I_{i-}$ and the current $I_{Q-}$. The currents $I_{IQ-}$ and $I_{IQ+}$ are delivered to the variable-gain amplifier 11.

The variable gain amplifier 11 is of a conventional type and comprises, for example, two pairs of differentially-configured transistors, transistors 81a and 82a forming the first pair and transistors 81b and 82b forming the second pair. For each of the pairs, the two transistors have their emitters coupled together in order to receive the currents $I_{IQ+}$ and $I_{IQ-}$, respectively. The collector of the transistors 81a and 81b receives the power supply voltage $V_{DD}$ or a battery voltage $V_{bat}$, if a battery voltage $V_{bat}$ higher than $V_{DD}$ is available within the integrated circuit integrating this circuit. The collector of the transistors 82a and 82b corresponds to amplified current outputs $I_{out-}$ and $I_{out+}$, respectively. The bases of the pairs of transistors 81 and 82 receive a differential voltage $V_{C}$, for example between the base of the transistor 81a and the base of the transistor 82a, but also between the base of the transistor 81b and the base of the transistor 82b. This voltage $V_{C}$ is representative of an attenuation coefficient to be applied to the variable-gain amplifier. Since this configuration is a known configuration, it is not necessary to describe it in more detail.

Such a circuit as that shown in FIG. 6 allows the functions of the filters 4 and 5, of the voltage-to-currrent converters 6 and 7, of the mixers 8 and 9, of the adder circuit 10 and of the variable-gain amplifier 11 to be integrated within the same circuit stage. Indeed, it will be noticed that the biasing of this stage is effected by means of the current source 32, of the resistor 34, of the resistor 47 and of the DC voltage $V_p$ from the input signals. Moreover, only the current flowing through the resistor 47 is important and the variable-gain amplifier 11 takes advantage of this same biasing current to effect the amplification which results in a lower total power consumption than if the stages were separate. The filter 70, carrying out the filtering functions of the filters 4 and 5, corresponds to the addition of a passive filter rendered active by the amplifier 30 without requiring any additional power.

Many variants of the invention are possible. In particular, the present description makes reference to MOS and bipolar type transistors. Those skilled in the art will understand that they may make use only of transistors of a single type, or a mixture of the two types, without this implying any modification to the functional structure described.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare the, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A mixer device for a transmission system comprising:
   a signal input terminal for receiving an input voltage that is representative of a modulating signal;
   two differential input terminals receiving two high-frequency signals in phase opposition relative to one another;
   a pair of first and second output terminals for delivering two currents that are representative of the high-frequency signals modulated by the modulating signal;
   a pair of transistors forming a differential circuit having two differential control inputs each coupled to one of the differential input terminals, two differential current outputs respectively coupled to the pair of output terminals and a common current output whose current is equal to a sum of the differential output currents;
   a current-to-voltage conversion element coupled to the common current output of the pair of transistors, capable of transforming the current delivered by this output into an output voltage;
   an amplifier having a positive input, a negative-feedback input and an output, wherein the amplifier is capable of delivering at its output an amplified signal that is representative of a signal present at the positive input, the positive input being coupled to the signal input terminal, the negative-feedback input being coupled to the current-to-voltage conversion element, and the output being coupled to each of the differential control inputs of the pair of transistors.

2. The mixer device of claim 1, further comprising a low-pass filter coupled between the current-to-voltage conversion element and the negative-feedback input of the amplifier.

3. The mixer device of claim 1, wherein the amplifier comprises an input stage followed by an output stage, and wherein the mixer device further comprises a compensation circuit linking a node between the input stage and the output stage with the common current output of the pair of transistors.

4. The mixer device of claim 1, further comprising a low-pass filter coupled between the input terminal and the positive input of the amplifier.

5. A differential mixer comprising:
   a first input terminal for receiving a voltage that is representative of a modulating signal;
   a second input terminal for receiving a voltage that is representative of an inverted modulating signal;
   two differential input terminals;
   a first output terminal;
   a second output terminal;
   a first mixer device comprising:
      a signal input linked to the first input terminal,
      two differential inputs receiving two high-frequency signals in phase opposition relative to one another, the two differential inputs being respectively coupled to the two differential input terminals,
      first and second outputs for delivering two currents that are representative of the high-frequency signals modulated by the modulating signal, the first output being coupled to the first output terminal, and the second output being coupled to the second output terminal,
      a pair of transistors forming a differential circuit having two differential control inputs each coupled to one of said differential inputs, two differential current outputs respectively corresponding to the first and second outputs and a common current output whose current is equal to the sum of the differential output currents,
      a current-to-voltage conversion element coupled to the common current output of the pair of transistors, capable of transforming the current delivered by this output into a voltage, and
      an amplifier having a positive input, a negative-feedback input, and an output, wherein the amplifier is capable of delivering at its output an amplified signal that is representative of the signal present at the positive input, the positive input corresponding to a signal input, the negative-feedback input being coupled to the current-to-voltage conversion element, and the output being coupled to each of the differential control inputs of the pair of transistors; and
   a second mixer device comprising:
      a signal input linked to the second input terminal,
      two differential inputs receiving two high-frequency signals in phase opposition relative to one another, the two differential inputs being respectively coupled to the two differential input terminals,
      first and second outputs for delivering two currents that are representative of the high-frequency signals modulated by the modulating signal, the first output being coupled to the second output terminal, and the second output being coupled to the first output terminal,
      a pair of transistors forming a differential circuit having two differential control inputs each coupled to one of the differential inputs, two differential current outputs respectively corresponding to the first and second outputs and a common current output whose current is equal to the sum of the differential output currents,
      a current-to-voltage conversion element coupled to the common current output of the pair of transistors, capable of transforming the current delivered by this output into a voltage, and
      an amplifier having a positive input, a negative-feedback input, and an output, wherein the amplifier is capable of delivering at its output an amplified signal that is representative of the signal present at the positive input, the positive input corresponding to the signal input, the negative-feedback input being coupled to the current-to-voltage conversion element, and the output being coupled to each of the differential control inputs of the pair of transistors.

6. The differential mixer of claim 5, wherein the first and the second mixer devices each comprises a low-pass filter coupled between the current-to-voltage conversion element and the negative-feedback input of the amplifier.

7. The differential mixer of claim 5, wherein each amplifier of the first and second mixer devices comprises an input stage followed by an output stage, and wherein each of the first and second mixer devices comprises a compensation circuit linking a node between the input stage and the output stage with the common current output of the pair of transistors.

8. The differential mixer of claim 5, further comprising a first low-pass filter coupled between the first input terminal and the signal input of the first mixer device, and a second low-pass filter coupled between the second input terminal and the signal input of the second mixer device.

9. A quadrature signal mixer comprising:
a differential output pair corresponding to a first and a second output terminals;
a first differential mixer comprising:
  a differential input pair corresponding to a first and a second input terminals, the first input terminal receiving a signal corresponding to a modulating signal I(t), and the second input terminal receiving a signal corresponding to an inverted modulating signal I(t);
  two differential input terminals receiving two high-frequency signals in phase opposition relative to one another;
  a first mixer device comprising:
    a pair of transistors forming a differential circuit having two differential control inputs each coupled to one of the differential input terminals, two differential current outputs respectively linked to the first and second output terminals and a common current output whose current is equal to the sum of the differential output currents,
    a current-to-voltage conversion element coupled to the common current output of the pair of transistors, capable of transforming the current delivered by this output into a voltage, and
    an amplifier having a positive input, a negative-feedback input and an output, wherein the amplifier is capable of delivering at its output an amplified signal that is representative of the signal present at the positive input, the positive input being linked to the first input terminal, the negative-feedback input being coupled to the current-to-voltage conversion element, and the output being coupled to each of the differential control inputs of the pair of transistors; and a second mixer device comprising:
  a pair of transistors forming a differential circuit having two differential control inputs each coupled to one of the differential input terminals, two differential current outputs respectively linked to the second and first output terminals and a common current output whose current is equal to the sum of the differential output currents,
  a current-to-voltage conversion element coupled to the common current output of the pair of transistors, capable of transforming the current delivered by this output into a voltage, and
  an amplifier having a positive input, a negative-feedback input and an output, wherein the amplifier is capable of delivering at its output an amplified signal that is representative of the signal present at the positive input, the positive input being linked to the second input terminal, the negative-feedback input being coupled to the current-to-voltage conversion element, and the output being coupled to each of the differential control inputs of the pair of transistors; and
a second differential mixer;
wherein high-frequency signals of the second differential mixer are in phase quadrature with respect to the high-frequency signals of the first differential mixer.

10. The quadrature signal mixer of claim 9, wherein the first and the second mixer devices of the first differential mixer each comprises a low-pass filter coupled between the current-to-voltage conversion element and the negative-feedback input of the amplifier.

11. The quadrature signal mixer of claim 9, wherein, in the first differential mixer, each amplifier of the first and second mixer devices comprises an input stage followed by an output stage, and wherein each of the mixer devices comprises a compensation circuit linking a node between the input stage and the output stage with the common current output of the pair of transistors.

12. The quadrature signal mixer of claim 9, further comprising a first low-pass filter coupled between the first input terminal and the signal input of the first mixer device the first differential mixer, and a second low-pass filter coupled between the second input terminal and the signal input of the second mixer device of the first differential mixer.

13. A data transmission system comprising:
means for producing two modulating signals and from a data stream, each modulating signal being delivered in differential mode;
a quadrature signal mixer receiving one of the modulating signals at each of its pairs of differential inputs, the quadrature signal mixer comprising:
  a differential output pair corresponding to a first and a second output terminals,
  a first differential mixer comprising:
    a differential input pair corresponding to a first and a second input terminals, the first input terminal receiving a signal corresponding to a modulating signal I(t), and the second input terminal receiving a signal corresponding to an inverted modulating signal I(t);
    two differential input terminals receiving two high-frequency signals in phase opposition relative to one another;
    a first mixer device comprising:
      a pair of transistors forming a differential circuit having two differential control inputs each coupled to one of the differential input terminals, two differential current outputs respectively linked to the first and second output terminals and a common current output whose current is equal to the sum of the differential output currents;
      a current-to-voltage conversion element coupled to the common current output of the pair of transistors, capable of transforming the current delivered by this output into a voltage;
      an amplifier having a positive input, a negative-feedback input and an output, wherein the amplifier is capable of delivering at its output an amplified signal that is representative of the signal present at the positive input, the positive input being linked to the first input terminal, the negative-feedback input being coupled to the current-to-voltage conversion element, and the output being coupled to each of the differential control inputs of the pair of transistors;

a second mixer device; and a second differential mixer;

wherein high-frequency signals of the second differential mixer are in phase quadrature with respect to the high-frequency signals of the first differential mixer; and means for variable-gain differential amplification coupled to the pair of differential outputs of the quadrature signal mixer.

* * * * *

UNITED STATES PATENT AND TRADEMARK OFFICE
CERTIFICATE OF CORRECTION

| | | |
|---|---|---|
| PATENT NO. | : 7,519,335 B2 | Page 1 of 1 |
| APPLICATION NO. | : 11/247989 | |
| DATED | : April 14, 2009 | |
| INVENTOR(S) | : Benoit Butaye et al. | |

It is certified that error appears in the above-identified patent and that said Letters Patent is hereby corrected as shown below:

Col. 14, claim 12, line 3, insert --of-- after "first mixer device"

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,519,335 B2
APPLICATION NO. : 11/247989
DATED : April 14, 2009
INVENTOR(S) : Benoit Butaye et al.

It is certified that error appears in the above-identified patent and that said Letters Patent is hereby corrected as shown below:

Col. 14, claim 12, line 26, insert --of-- after "first mixer device"

This certificate supersedes the Certificate of Correction issued May 19, 2009.

Signed and Sealed this

Ninth Day of June, 2009

JOHN DOLL
*Acting Director of the United States Patent and Trademark Office*